United States Patent [19]

Houpt

[11] Patent Number: 4,591,950
[45] Date of Patent: May 27, 1986

[54] CIRCUIT BOARD-TERMINAL-HOUSING ASSEMBLY

[75] Inventor: Grover K. Houpt, Wayne, Pa.

[73] Assignee: American Manufacturing Company, Inc., King of Prussia, Pa.

[21] Appl. No.: 530,705

[22] Filed: Sep. 9, 1983

[51] Int. Cl.4 ............................................ H05K 5/02
[52] U.S. Cl. .................................. 361/399; 361/406; 361/426; 174/52 FP
[58] Field of Search .............................. 361/390–393, 361/394–400, 413, 412, 415, 421, 426, 428; 206/328, 331, 334; 211/41; 174/50–52; 339/17 R, 17 L, 17 LC, 17 M, 17 LM, 17 N

[56] References Cited

U.S. PATENT DOCUMENTS

| | | | |
|---|---|---|---|
| 2,762,026 | 3/1953 | Knohl | 339/192 |
| 3,090,936 | 5/1963 | Maltby | 339/210 |
| 3,523,268 | 8/1970 | Foster | 361/403 X |
| 3,830,979 | 8/1974 | McIntosh | 361/398 X |
| 3,833,839 | 9/1974 | Debaigt | 339/17 N |
| 4,152,671 | 5/1979 | Tuma et al. | 361/399 X |
| 4,222,089 | 9/1980 | MacAskill et al. | 361/311 X |
| 4,226,491 | 10/1980 | Kazama et al. | 361/399 |
| 4,247,882 | 1/1981 | Prager et al. | 361/391 |

FOREIGN PATENT DOCUMENTS

| | | | |
|---|---|---|---|
| 2013738 | 10/1971 | Fed. Rep. of Germany | 361/399 |
| 1339327 | 8/1963 | France | 361/399 |
| 1303849 | 10/1973 | United Kingdom | 174/52 FP |

Primary Examiner—R. R. Kucia
Assistant Examiner—T. Basma
Attorney, Agent, or Firm—Nelson E. Kimmelman

[57] ABSTRACT

An insulating housing has a circuit board mounted on its interior with separate conductive tab end portions of the board protruding outwardly through apertures in the housing. The tab portions have printed thereon conductive parts which connect with selected printed points or components on the board within the housing. Each tab has a hole for a screw in its conductive part so that when a wire is wound around the screw and the screw is tightened, good low-ohmic contact with a designated part of the board is made and the tab is positionally fixed to the housing. Slots between the tabs permit each screw binding post to be electrically insulated from its adjacent post by the interposition of integrally molded perpendicular barriers in the slots.

11 Claims, 3 Drawing Figures

CIRCUIT BOARD-TERMINAL-HOUSING ASSEMBLY

BACKGROUND OF THE INVENTION
A. FIELD OF THE INVENTION

This invention relates to electrical connector subassemblies and in particular to integrated terminal block-housing-circuit board apparatus.

B. PRIOR ART

It has long been the practice in electrical and electromechanical fields where there are housings or chassis for electrical equipment, to mount terminal blocks made of insulating material to desired portions of the housings. Wires are than attached to the terminals on the block. These terminal blocks are generally made of some plastic and have a plurality of screw or other types of terminals. For example, the terminals of one type each comprise metallic members or pieces having a generally U-shaped configuration. The horizontal bight portion has a threaded aperture for the screw connector. One leg penetrates a vertical hole and is adapted to be connected by soldering or other means to a selected point in an associated circuit board. It also includes another leg portion intended to anchor the metal member to the block by being inserted with a force fit into a slit in the block. Another type is substantially L-shaped having one vertical leg that passes through a slit in the block for attachment to any point on a circuit board. The other leg is horizontal and has two apertures. One of them is threaded to engage the screw around which a wire is wound or some other connector such as a spade connector is slid under before tightening the screw. The second hole is unthreaded and a pin is driven through it into the blocks to retain the metallic member in its proper cell between upright insulating barriers formed in the block.

Still other forms of terminal blocks exist but they all require separate attachment to the housing or other part of the apparatus and their manufacture requires relatively complicated assembly techniques as well as individual soldering attachments from each screw-terminal post to a lead in the associated circuit or circuit board.

There also exist binding post terminals for association with the edges of printed circuit boards. These consist of individual metal pieces which have a generally U-shaped clip-like construction. Each has a screw which is passed transversely through aligned threaded holes in each leg portion. The leg portions make ohmic contact with conductive portions formed either on the top or undersurface of the board as the case may be. Each must be assembled by slipping it over an edge of a printed circuit board which has at least one aperture that can be aligned with a corresponding threaded screw hole in the metal clip itself. Ordinarily there is no associated anti-leakage insulating barrier between closely adjacent ones of these individual binding posts.

The prior art U.S. Pat. No. 4,247,882 to Prager shows terminal blocks and associated boards or plates having tab ends separated by slots, with contacts as well as screw terminals, but there is no showing of integral construction of the tab ends or the screw terminals with the printed circuit board itself. Knohl U.S. Pat. No. 2,762,026 shows a plug of ceramic rubber insulating material having a plurality of sheet metal prongs that are attached to terminals in recesses by means of screws. However, the plug has no printed circuit on it and there are no barrier walls separating adjacent terminals from one another. Maltby U.S. Pat. No. 3,090,936 shows electrical connectors having U-shaped members which engage terminals in a terminal block. It also shows an intermediate portion and wire connections as well as slots which engage vertical walls. However, there is no printed circuit involved and the U-shaped members are not coplanar or formed integrally with a circuit board. Callan U.S. Pat. No. 3,729,857 shows a printed circuit card having several slits and a strip which is an electrical connector mounted on its edge. The strip has sockets for receiving pins on a terminal board which are, in turn, connected to screw terminals separated by perpendicular insulating barriers. The edge portions of the board which are separated by slots are not equipped with holes or meant to receive screws as in the present invention.

It is therefore among the objects of the present invention to provide:

1. An integral housing-terminal board-circuit board assembly that cuts down on many separate assembly operations.

2. A cheaper substitute for the assemblage of separate terminal blocks, circuit boards, and housings on which the blocks are mounted.

3. A circuit board which has integrally formed apertured tabs to which wires may be directly attached by screws which simultaneously anchor the wired tabs to the housing itself.

SUMMARY OF THE INVENTION

An insulated housing for a circuit board has apertures through which tab ends of the board protrude outwardly when the board is mounted inside the housing. The tab ends have integrally-formed conductive portions that are connected to desired points on the circuit on the board and those portions are also constructed to receive and make electrical connection with ends of wire leads by means of screws or other solderless connections.

DETAILED DESCRIPTION OF THE DRAWINGS

Figure 1:
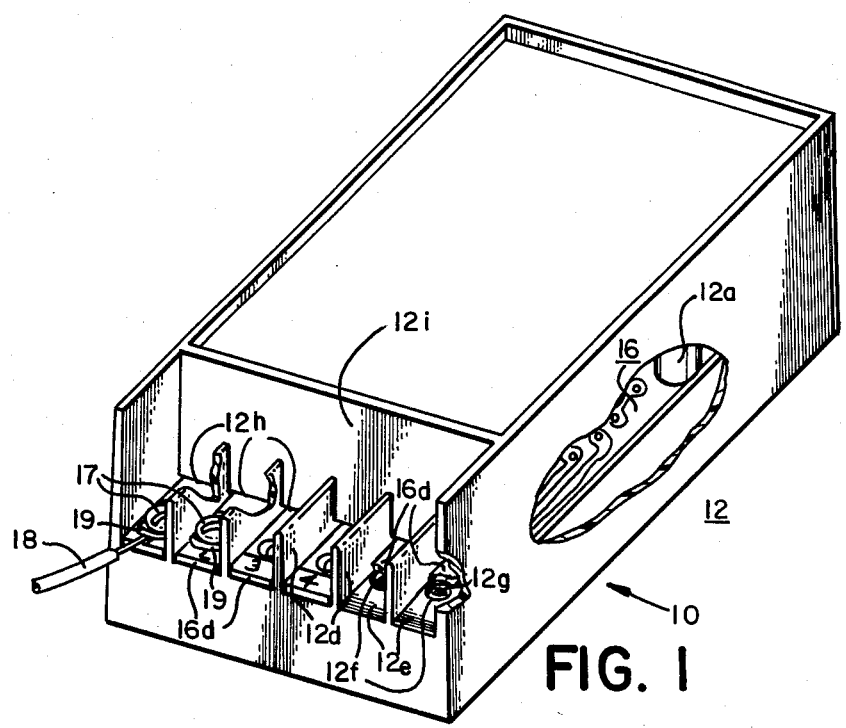
FIG. 1 is a perspective view of the invention, partly sectional and partly broken-away.

Referring to the three figures, there is shown generally at the numeral 10 an embodiment of the present invention. It includes a plastic molded housing 12 having an interior 13 in which a circuit board 16 is mounted. Board 16 has at one end a plurality of tab portions 16d separated by slots 16e. Apertures 16c in board 16, when the board is slid through horizontal slots 12h in the housing, become aligned with apertures 12b formed in two substantially cylindrical plastic mounting posts 12a that were integrally molded into the housing 12. Sheet-metal screws 15 are screwed into the apertures 12b to fasten the board 16 to the interior 13.

When the board 16 has been so inserted, the left end portion of the housing 12 will appear as shown in FIG. 1. The tab portions 16d, which bear numerals from 1 to 6, because of the slots 16e which separate them are positioned above portions 12e of the housing which lie between upright insulating barrier walls 12d that are also integrally molded into the housing 12. These barrier walls are well known in the terminal block art and are required by such electrical safety standard organizations as Underwriters Labs, Inc. and the Canadian Standards Association, What they do is to lengthen the leakage path between any two points at which electrical potential appears.

When so inserted, the apertures 16f formed in respective ones of the tab portions will be aligned with corresponding apertures 12f in the housing portions 12e. These apertures are originally molded integrally into cylindrical or other shaped wells 12c and then metallic inserts 12f are pressed into them for a friction fit, the inserts 12f being themselves internally threaded as shwon at 12g.

It is seen that around the apertures 16f formed in the board 16 there are electrically conductive areas 20 comprising solder or other conductive deposits, for example. As may be seen in FIG. 3, those electrical portions 20 are connected to various apertures 16g formed in the board 16 into which the leads of desired electrical components (shown in FIG. 2) are inserted and soldered to make electrical connections.

When it is desired to make external electrical connections to the apparatus 10, the wires in insulated wires 18 are wound around the shafts of screws 17 under metallic retainers 19 whereupon the screws 17 are tightened to effect a fixed, low-ohmic connection while simultaneously firmly anchoring the tab end of the board to the housing 16.

In the illustrated embodiment, one circuit board is shown in the interior of the housing with its terminal tabs protruding through slits therein. Other embodiments may have two or more such boards, vertically spaced from one another, protruding through corresponding sets of vertically-spaced slits. These boards may be disposed in stepped relation to one another to permit easier access to adjacent rows of terminals.

In still other embodiments, the boards may have additional tabs on the opposite end or on adjacent sides.

Figure 2:
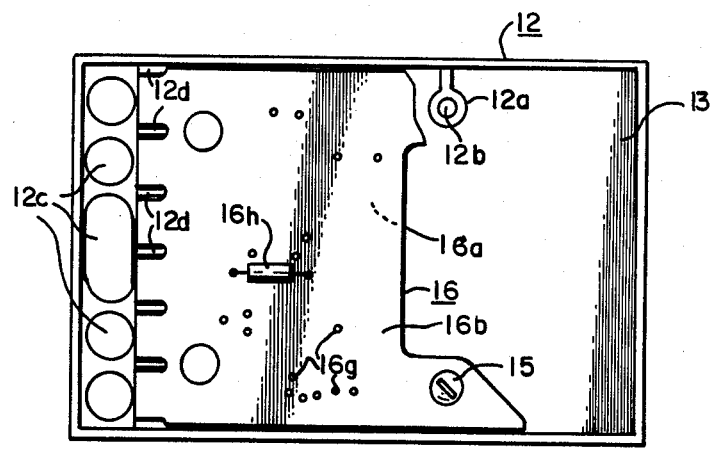
FIG. 2 is a bottom plan view of the apparatus shown in FIG. 1.
Figure 3:
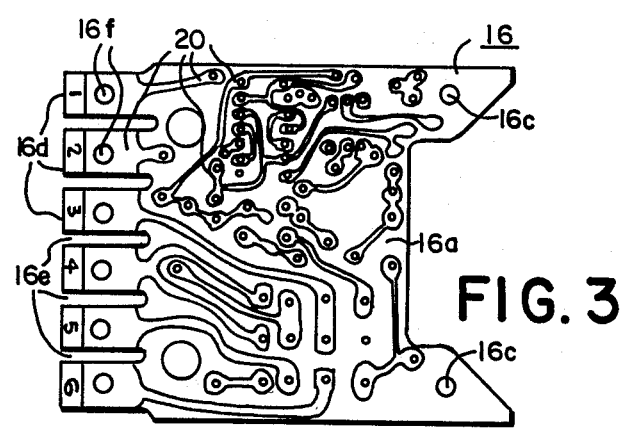
FIG. 3 is a top plan view of a part of the assembly shown in FIGS. 1 and 2.

It should be understood that the circuit board illustrated in the embodiment of FIGS. 1-3 may be one with solder-floated connections or etched copper connections, or a printed or integrated circuit type, or any equivalent structure.

In still another embodiment, the planar member need not be mounted, even partially, inside the housing. It could be mounted on an outside surface of the housing or base on which barrier walls could be formed to engage the slots between the tubular portions.

The embodiments of the invention in which an exclusive property or privilege is claimed are defined as follows:

1. Electromechanical apparatus comprising:
   (a) a housing having a nonconductive external portion and an interior, said external portion having a wall with a selected number of first aligned apertures formed therein that bring the interior of said housing into communication with said external portion, said external portion also including a shelf-like planar part in which a selected number of second apertures are formed for engagement by fastening means, and
   (b) a circuit board member all of whose parts lie within a single plane mounted in said interior so that predetermined conductive portions thereof extend through said first apertures and overlie said planar part of said external portion in adjacent parallel relationship, said predetermined conductive portions being electrically coupled to predetermined electrical pathways on said member within said interior, said predetermined conductive portions also having a selected number of third apertures formed therein which are aligned with corresponding ones of said second apertures for engagement by fastening means inserted through said third apertures into said second apertures.

2. The electromechanical apparatus according to claim 1 wherein said first apertures are slits and said second apertures are generally circular in cross-section and wherein said planar member has its predetermined conductive portions slid from inside said housing externally through said slits and is releasably retained in said interior.

3. The electromechanical apparatus according to claim 2 wherein said second apparatus are threaded, said means for connecting also being threaded and adapted to engaged said second apertures.

4. The electromechanical apparatus according to claim 1 wherein said predetermined portions of said planar member are separated by a plurality of slots into discrete tab portions, and further wherein said housing adjacent said slots has a plurality of substantially planar insulating barrier members formed thereat, said barrier members being respectively engaged by said slots when said substantially planar member is mounted in position in said interior.

5. The electromechanical apparatus according to claim 4 wherein said third apertures are respectively located in said tab portions and further wherein said tab portions have conducting regions formed thereon which are substantially contiguous with respective ones of said third apertures.

6. The electromechanical apparatus according to claim 5 wherein a plurality of means are provided which engage respectively said second and third apertures to enable coupling of electricity-carrying members thereto.

7. The electromechanical apparatus according to claim 6 wherein said plurality of means are threaded and respectively engage said third apertures.

8. A substantially planar member adapted to be mounted to a housing having a non-conductive external portion and an interior, said housing having a selected number of first apertures formed in a wall which bring the interior of said housing into communication with said external portion, said housing also having a selected number of second apertures formed in a shelf-like planar part, said external portion also having a predetermined number of substantially parallel insulating barriers disposed at right angles to such shelf-like planar part, said member comprising: predetermined conductive portions which are co-planar with the rest of said planar member, said predetermined conductive portions being electrically coupled to predetermined electrical pathways on said member, said predetermined conductive portions also having a selected number of third apertures that are adapted to be respectively aligned with corresponding ones of said second apertures for engagement by fastening means inserted through said third apertures into said second apertures when they are so aligned.

9. The electromechanical member according to claim 8 wherein said conductive portions comprise a plurality of tabs separated by slots which are engaged by respective ones of said barriers.

10. The electromechanical member according to claim 8 wherein said predetermined conductive portions bear respective indicia formed simultaneously with the formation of said conductive portions.

11. The electromechanical member according to claim 13 wherein said indicia are formed of the same material as said conductive portions but are separated from the latter by insulating material.

* * * * *